(12) United States Patent
Kim et al.

(10) Patent No.: US 9,262,952 B2
(45) Date of Patent: Feb. 16, 2016

(54) ORGANIC LIGHT EMITTING DISPLAY PANEL

(71) Applicant: Samsung Display Co., Ltd., Yongin, Gyeonggi-do (KR)

(72) Inventors: Ji-Hye Kim, Yongin (KR); Ji-Hyun Ka, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 329 days.

(21) Appl. No.: 14/025,593

(22) Filed: Sep. 12, 2013

(65) Prior Publication Data

US 2014/0354285 A1    Dec. 4, 2014

(30) Foreign Application Priority Data

Jun. 3, 2013 (KR) .......................... 10-2013-0063694

(51) Int. Cl.
  *G01R 31/00* (2006.01)
  *G01R 31/02* (2006.01)
  *H01L 29/08* (2006.01)
  *G09G 3/00* (2006.01)
  *H01L 21/66* (2006.01)
  *G01R 31/44* (2006.01)
  *G01R 31/26* (2014.01)

(52) U.S. Cl.
  CPC ............. *G09G 3/006* (2013.01); *G01R 31/2632* (2013.01); *G01R 31/44* (2013.01); *H01L 22/30* (2013.01)

(58) Field of Classification Search
  CPC ..... G09G 3/006; G01R 31/2632; G01R 31/44; H01L 22/30
  USPC ...................... 324/414, 403, 762.07
  See application file for complete search history.

(56) References Cited

U.S. PATENT DOCUMENTS 8,178,865 B2 * 5/2012 Jeong ..................... G09G 3/006
                                                      257/350
8,614,591 B2 * 12/2013 Kim ....................... G09G 3/006
                                                      324/403

FOREIGN PATENT DOCUMENTS

| JP | 2012-063198 | 3/2012 |
| KR | 1020030058761 | 7/2003 |
| KR | 1020040090618 | 10/2004 |
| KR | 1020120017714 | 2/2012 |

\* cited by examiner

*Primary Examiner* — Amy He
(74) *Attorney, Agent, or Firm* — Innovation Counsel LLP (57) ABSTRACT

Provided is an organic light emitting display panel. The organic light emitting display panel includes a pixel unit including a plurality of pixels I displaying mutually different colors, a plurality of data pads electrically connected to wirings extending from the data lines, each of the plurality of data pads being connected to corresponding data lines, respectively, and an array test unit applying an array test signal to the plurality of pixels of the pixel unit, and sensing a current outputted from the plurality of pixels. The array test unit includes an array test pad electrically connected to a plurality of data pads through a plurality of array test switches.

20 Claims, 5 Drawing Sheets

ORGANIC LIGHT EMITTING DISPLAY PANEL

CROSS-REFERENCE TO RELATED PATENT APPLICATION

This application claims the benefit of Korean Patent Application No. 10-2013-0063694, filed on Jun. 3, 2013, in the Korean Intellectual Property Office, the disclosure of which is incorporated herein in its entirety by reference.

BACKGROUND OF THE INVENTION

1. Field of the Invention

Embodiments of the present invention relate to an organic light emitting display panel.

2. Description of the Related Art

Organic light emitting display apparatuses display images using organic light emitting diodes (OLED) and attract public attention due to outstanding brightness and color purity.

Conventional organic light emitting display apparatuses have high-density integrated circuits integrated with driving circuits which generate and apply scan signals and data signals to pixels. The high-density integrated circuits are manufactured and connected to array substrates, on which pixels are arranged, by using a tape automated bounding (TAB) method. However, organic light emitting display apparatuses to which driving circuits and pixel-array substrates are connected by using the TAB method need a plurality of leads for connecting pixel-array substrates and driving circuits. This process may cause difficulties in manufacturing processes and may deteriorate reliability and yields of organic light emitting display apparatuses. Since costs of high-density integrated circuits are generally expensive and thus, costs of organic light emitting display apparatuses may be increased.

To overcome such limitations, chip-on-glass (COG) or system-on-panel (SOP) technologies are used for organic light emitting display apparatuses. These technologies implemented by directly bonding pads of the integrated circuits or integrating driving circuits on pixel-circuit array substrates on which pixel circuits are arranged. As described above, since COG or SOP types of organic light emitting display apparatuses eliminate additional processes for connecting driving circuits and pixel-circuit array substrates through another device such as flexible printed circuit board, reliability and yields of products may be increased. However, it is difficult to test arrays in the panel.

SUMMARY OF THE INVENTION

Embodiments of the present invention provide a panel capable of detecting a defect of a pixel unit in an early stage of its manufacturing process, for example after an array process.

According to an aspect of the present invention, there is provided an organic light emitting display panel. The organic light emitting display panel may include a pixel unit including a plurality of pixels displaying mutually different colors, a plurality of data pads electrically connected to wirings extending from the data lines, each of the plurality of data pads being connected to corresponding data lines, respectively, and an array test unit applying an array test signal to the plurality of pixels of the pixel unit, and sensing a current outputted from the plurality of pixels. The array test unit may comprise an array test pad electrically connected to a plurality of data pads through a plurality of array test switches The array test unit may a demultiplexer having the plurality of array test switches, each of the array test switches being connected between one of the plurality of data pads and the array test pads.

A gate of each of the plurality of array test switches may be connected to one of a plurality of wirings supplying the a plurality of array test control signals The plurality of array test switches may include first array test switches, gates of which are connected in common to a wiring supplying a first array test control signal, second array test switches, gates of which are connected in common to a wiring supplying a second array test control signal, third array test switches, gates of which are connected in common to a wiring supplying a third array test control signal, and fourth array test switches, gates of which are connected in common to a wiring supplying a fourth array test control signal.

The demultiplexer may include a plurality of switch groups connecting the same number of sequential data pads as a number of array test control signals to one array test pad, and each switch group may include a plurality of array test switches whose gates are connected to the wirings supplying the each array test control signals and the plurality of array test switches of the respective switch groups are sequentially turned on in response to the array test control signal.

The organic light emitting display panel may further include a wiring test unit testing short-circuits and open-circuits of the wirings extending from the data lines.

The wiring test unit may include a plurality of wiring test switches, in which a gate of each array test switch is connected in common to a wiring supplying a wiring test control signal, a first terminal of each array test switch is connected to the array test pads, and a second terminal of each array test switch receives a wiring test signal.

The wiring test unit may maintain an off state while the array test unit is performing an array test.

The organic light emitting display panel may further include a data switch unit selectively applying data signals outputted from the data pads to the pixel column of the pixel unit.

The organic light emitting display panel may further include a data drive unit bonded to the data pads by using a chip-on-glass (COG) method and applying data signals to the data lines.

According to another aspect of the present invention, there is provided an organic light emitting display panel. The organic light emitting display panel includes a plurality of array test pads configured to be connected to probe pins of an array test apparatus and receiving an array test signal to test a pixel circuit array and a demultiplexer disposed between a plurality of data pads connected to respective wirings extending from data lines of the pixel unit and a test pad and selectively applying the array test signal provided from the array test pad to a pixel of the pixel unit through the data pad.

The demultiplexer may include a plurality of array test switches, in which a gate of each array test switch is connected to one of a plurality of wirings supplying a plurality of array test control signals, a first terminal of each array test switch is connected to one of the plurality of data pads, and a second terminal of each array test switch is connected to one of the plurality of array test pads.

The plurality of array test switches may include first array test switches, gates of which are connected in common to a wiring supplying a first array test control signal, second array test switches, gates of which are connected in common to a wiring supplying a second array test control signal, third array test switches, gates of which are connected in common to a wiring supplying a third array test control signal, and fourth array test switches, gates of which are connected in common to a wiring supplying a fourth array test control signal.

The demultiplexer may include a plurality of switch groups connecting the same number of sequential data pads as a number of the array test control signals to one array test pad, and each switch group may include a plurality of array test switches whose gates are connected to wirings supplying the respective array test control signals and the plurality of array test switches of the respective switch groups are sequentially turned on in response to the array test control signal.

The array test pad may have a larger size than that of the data pad and an interval between the array test pads is wider than an interval of the data pads.

The organic light emitting display panel may further include a wiring test unit testing shorts and opens of the wirings extended from the data lines.

The wiring test unit may include a plurality of wiring test switches, gates of which are connected in common to a wiring supplying a wiring test control signal, first terminals of which are connected to the array test pads, respectively, and second terminals of which receive a wiring test signal.

The wiring test unit may maintain an off state while the array test unit is performing an array test.

The organic light emitting display panel may further include a data switch unit selectively applying data signals outputted from the data pads to the pixel column of the pixel unit.

The organic light emitting display panel may further include a data drive unit bonded to the data pads by using a COG method and applying data signals to the data lines.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

As used herein, the term "and/or" includes any and all combinations of one or more of the associated listed items.

Hereinafter, with reference to the attached drawings, various embodiments of the present invention will be described in detail to allow those skilled in the art to easily execute. Embodiments of the present invention may be provided as various different forms and is not limited to the embodiments.

To clearly describe the present invention, a part regardless of a description will be omitted. Throughout the specification, like reference numerals designate like elements.

Also, in the overall specification, when it is described that a part "comprises" an element, if there is no particular mention, this means that the part may further include another element, instead of excluding the other element. Also, in the entire specification, "being on an object" means "being located on a top or a bottom of the object" but does not means "surely being above the object based on a gravitational direction".

Figure 1:
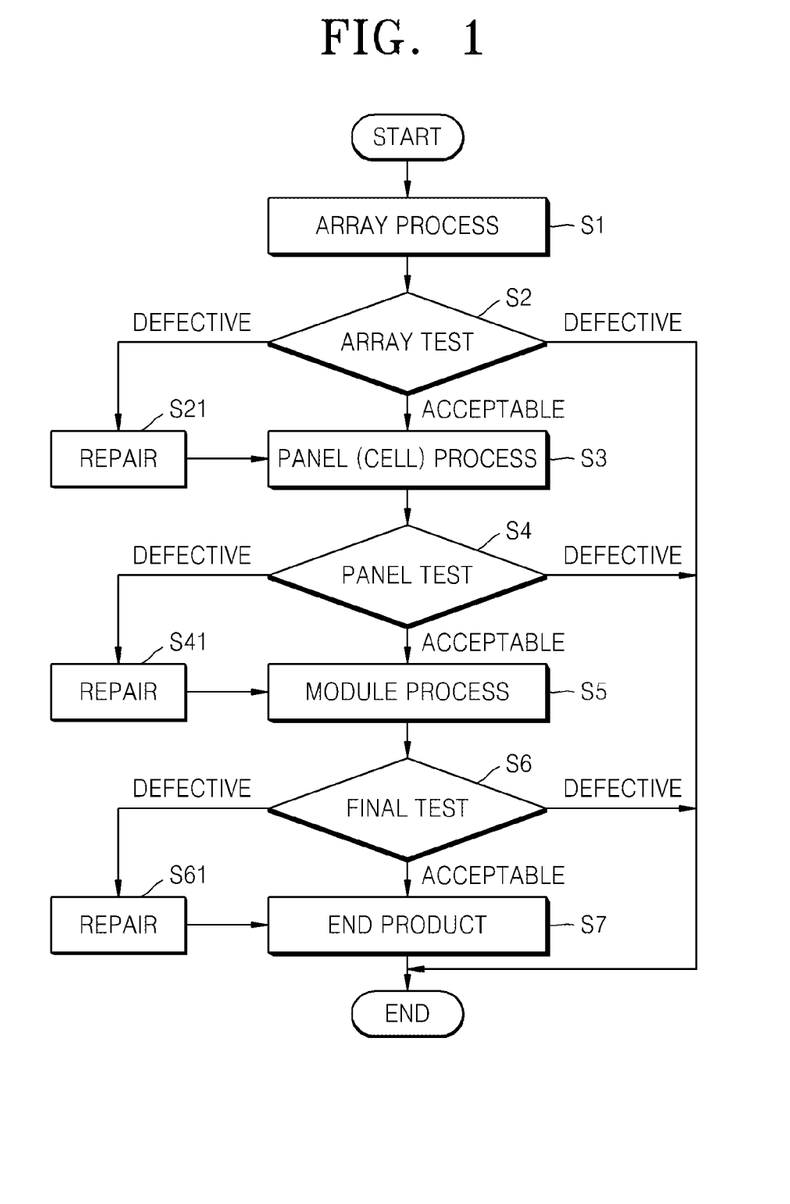
FIG. 1 is a flowchart illustrating a method of manufacturing an organic light emitting display apparatus according to an embodiment of the present invention.

FIG. 1 is a flowchart illustrating a method of manufacturing an organic light emitting display apparatus according to an embodiment of the present invention.

An array process S1 for forming a pixel-circuit array on a substrate is performed. Respective pixel circuits may include two or more thin film transistors (TFT) and one or more capacitors. An array test S2 for detecting a defect of the pixel-circuit array is performed. In the array test S2, it is tested whether or not the TFT normally operates. A pixel circuit determined as a defect in the array test S2 passes through a repair process S21 or is scraped as defective when it is impossible to repair the pixel circuit.

An acceptable pixel array or a repaired pixel array passes through a panel (cell) process S3 for forming an organic light emitting diode (OLED) by forming an anode electrode, an organic emissive layer, and a cathode electrode and is transferred to a panel test S4. The panel test S4 may include a lighting test, a leakage current test and/or aging test. Similarly, a panel determined as a defect in the panel test S4 passes through a repair process S41 or is scraped as defective when it is impossible to repair the panel determined as the defect.

An acceptable panel or a repaired panel passes through a module process S5 and a final test S6. A module determined as defective passes through a repair process S61 or is scraped as defective when it is impossible to repair the module.

In the present embodiment, since a defect in operation of a TFT is tested just after the array process S1. Defects in a pixel-circuit array can be repaired in an early stage of the process, and thereby a production yield can be increased. Also, manufacturing time and costs may be reduced by omitting a panel (cell) process and a module process with respect to a defective pixel-circuit array that is scraped at the end of the process.

Figure 2:
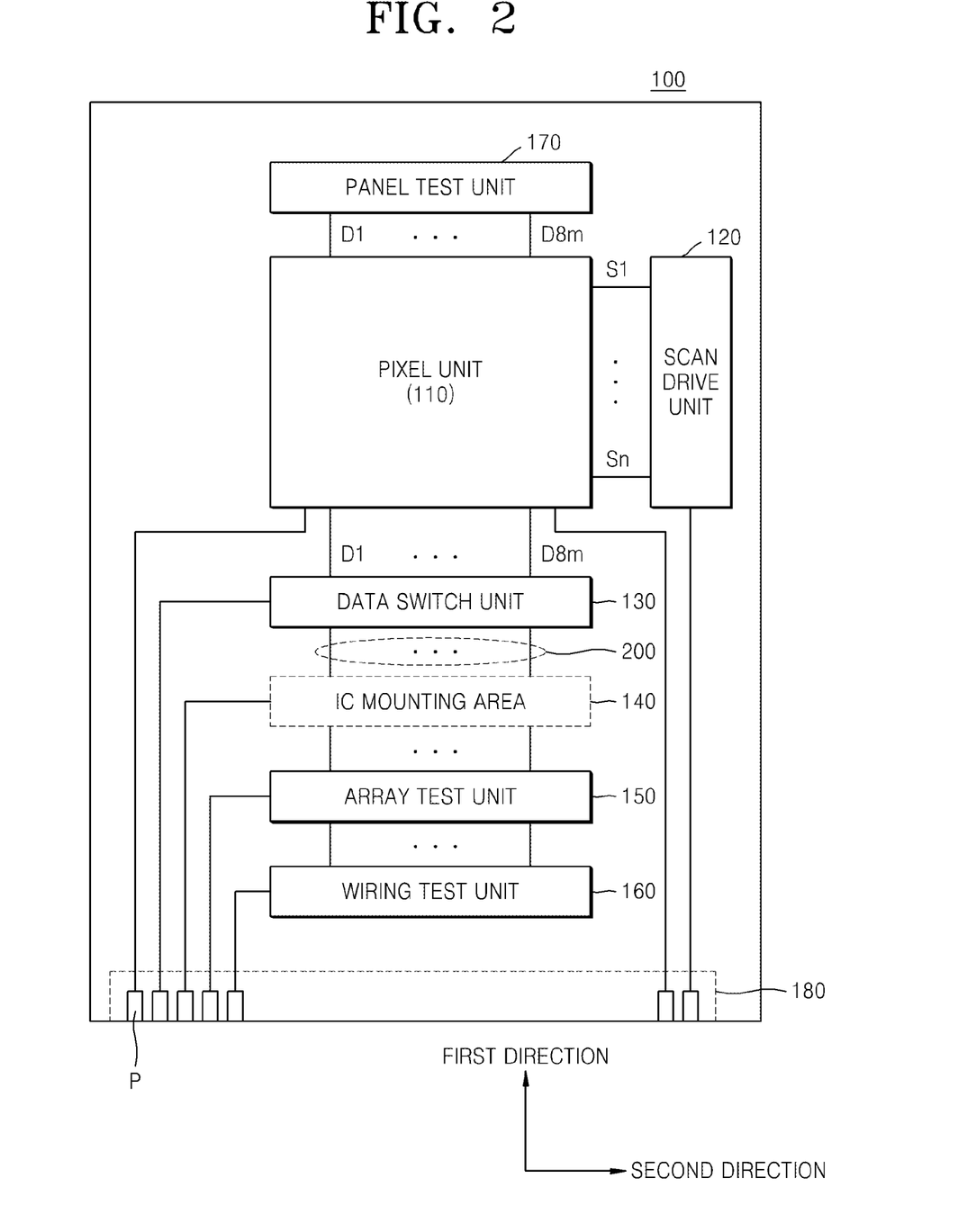
FIG. 2 is a schematic top view illustrating an organic light emitting display panel according to an embodiment of the present invention.

FIG. 2 is a schematic top view illustrating an organic light emitting display panel 100 according to an embodiment of the present invention.

Referring to FIG. 2, the organic light emitting display panel 100 includes a pixel unit 110, a scan drive unit 120, a data switch unit 130, an integrated circuit (IC) mounting area 140, an array test unit 150, a wiring test unit 160, a panel test unit 170, and a pad unit 180.

The pixel unit 110 includes first pixels, second pixels, and third pixels, which are located in the vicinity of intersection parts of data lines D1 to D8m and scan lines S1 to Sn, and emit different colors from one another. The data lines D1 to D8m extend in a first direction, and the scan lines S1 to Sn extend in a second direction.

The scan drive unit 120 generates scan signals in response to scan drive voltages, VDD and VSS, and a scan control signal SCS supplied from the outside and sequentially supplies the scan signals to the scan lines S1 to Sn.

The data switch unit 130 is connected to one end of the data lines D1 to D8m. The data switch unit 130 is provided to reduce a size of an IC mounted on the IC mounting area 140 and may include a demultiplex circuit having a plurality of switching devices. The data switch unit 130 maintains an off-state while the panel test S4 of the organic light emitting display panel 100 is being performed, thereby electrically insulating a data drive unit (not shown) from the pixel unit 110.

A plurality of data pads connected to wirings extending from the data lines D1 to D8m of the pixel unit 110, respectively, is arranged on the IC mounting area 140. The data drive unit is bonded to the data pads by using a chip-on-glass (COG) method and is mounted on the IC mounting area 140. The data drive unit generates a data signal in response to display data and a data control signal DCS and supplies the data signal to the data lines D1 to D8m. The data switch unit 130 selectively applies the data signal outputted from the data drive unit to a pixel column of the pixel unit 110.

The array test unit 150 tests whether or not the TFTs and the capacitors formed on the respective pixels of the pixel unit 110 are defective. The array test unit 150 may be formed of a demultiplex circuit including a plurality of switching devices. The array test unit 150, during the array test S2, receives an array test signal and an array test control signal, which are direct currents, and selectively supplies the array test signal to a pixel column of the pixel unit 110 in response to the array test control signal.

The wiring test unit 160 detects short-circuits and open-circuits of wirings arranged in a fanout unit 200, that is, the wirings extended from the data lines D1 to D8m of the pixel unit 110 to the IC mounting area 140. The wiring test unit 160 receives a wiring test signal and a wiring test control signal, which are direct currents, and supplies the wiring test signal to the wirings arranged in the fanout unit 200 in response to the wiring test control signal. On the other hand, the wiring test unit 160 is an off state during the array test S2. The wiring test unit 160 may test short-circuits/open-circuits of the wirings of the fanout unit 200 during the panel test S4 after the array test S2.

The panel test unit 170 is connected to another end of the data lines D1 to D8m. The panel test unit 170 receives a panel test signal and a panel test control signal, which are direct currents, while performing the panel test S4, and supplies the panel test signal to the data lines D1 to D8m in response to the panel test control signal. On the other hand, the panel test unit 170 is an off state during the array test S2.

The pad unit 180 includes a plurality of pads P for transferring voltages and/or signals supplied from the outside to the inside of the organic light emitting display panel 100. Although there is shown one wiring connecting the pad P to the respective units of the organic light emitting display panel 100 in FIG. 1, actually, the wiring may be formed as a plurality of wirings. For example, the wiring supplying signals to the scan drive unit 120 from the pad P of the pad unit 180 may be formed of five wirings receiving scan drive voltages VDD/VSS, a start pulse SP as a scan control signal SCS, a scan clock signal, and an output enable signal OE.

On the other hand, although not shown in the drawings, the organic light emitting display panel 100 may further include an emission control unit for applying an emission control signal to the pixel unit 110 to fully apply test signals to the first pixels, the second pixels, and the third pixels during the panel test S4.

Figure 3:
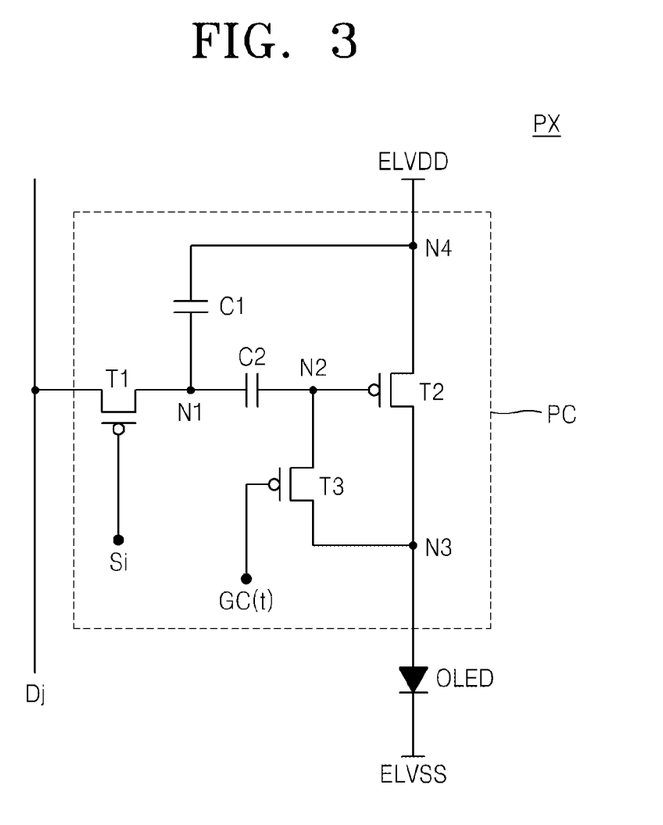
FIG. 3 is an equivalent circuit view illustrating a unit pixel of an organic light emitting display panel to which an array test method according to an embodiment of the present invention may be applied.

FIG. 3 is an equivalent circuit view illustrating a unit pixel of an organic light emitting display panel to which an array test method according to the present embodiment may be applied. A pixel PX includes an OLED and a pixel circuit PC supplying a current to the OLED.

A first TFT T1 is a switching transistor, in which a gate is connected to a scan line and receives a scan signal Si, a first terminal is connected to a data line and receives a data signal Dj, and a second terminal is connected to a first node N1.

A second TFT T2 is a driving transistor, in which a gate is connected to a second node N2, a first terminal is connected to a fourth node N4 and receives a first driving voltage ELVDD, and a second terminal is connected to an anode electrode of the OLED and a first terminal of a third TFT T3 at a third node N3.

In the case of the third TFT T3, a gate receives a control signal GC(t) for compensating a threshold voltage of the second TFT T2, a first terminal is connected to the second terminal of the second TFT T2 at the third node N3, and a second terminal is connected to the gate of the second TFT T2 and a second capacitor C2 at the second node N2.

A first capacitor C1 is connected between the first node N1 and a fourth node N4, and stores the data signal, and the second capacitor C2 is connected between the first node N1 and the second node N2 and controls a threshold voltage of the first TFT T1.

The anode electrode, that is, a pixel electrode of the OLED is connected to the second terminal of the second TFT T2 and the first terminal of the third TFT T3 at the third node N3, and a cathode electrode, that is, a common electrode receives a second driving voltage ELVSS.

The first TFT T1 transmits a corresponding data signal Dj in response to the scan signal Si, the second TFT T2 supplies a driving current to the OLED in response to the data signal Dj transmitted to the gate of the second TFT T2 through the first TFT T1 and the second capacitor C2. The third TFT T3 compensates the threshold voltage of the second TFT T2 in response to the control signal GC(t).

Although there is shown a 3T2C structure as the pixel circuit PC in FIG. 3, the array testing method may be applicable to a pixel circuit formed of 2T1C excluding the third TFT T3 and the second capacitor C2. The array testing method may be applicable to pixel circuits including various combinations of other TFTs and capacitors replaceable for the third TFT T3 and the second capacitor C2. Also, although there is shown PMOS-type TFTs in FIG. 3, NMOS-type TFTs may be provided, in which waveforms of signals for driving the same may be reversed.

In the array test S2, the pixel circuit PC is formed in the pixel unit 110 and it is tested before forming the OLED to check whether or not the pixel circuit PC is defective.

Figure 4:
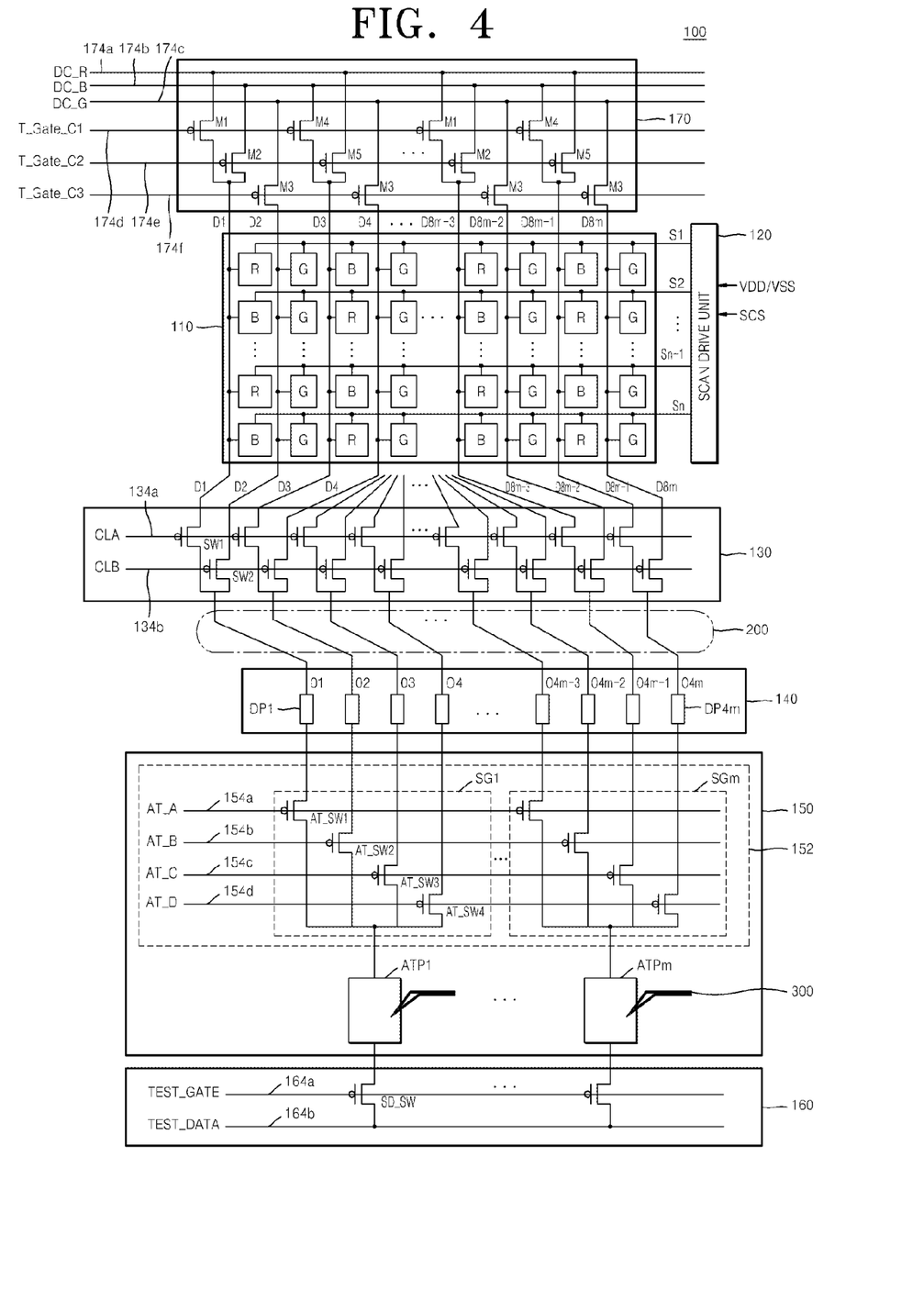
FIG. 4 is a top view illustrating an example of the organic light emitting display panel shown in FIG. 2.

FIG. 4 is a top view illustrating an example of the organic light emitting display panel 100.

Referring to FIG. 4, the pixel unit 110 includes the first pixels, the second pixels, and the third pixels emitting different colors. The first pixels and the second pixels are alternately arranged in the same column line and the third pixels are arranged in a column line adjacent the column line in which the first pixels and the second pixels are arranged. The respective pixels include the pixel circuit PC shown in FIG. 3.

The first pixels may be red pixels R emitting red light, the second pixels may be blue pixels B emitting blue light, and the third pixels may be green pixels G emitting green light.

The red pixels R and the blue pixels B are alternately arranged in the same column line, and the green pixels G having color sensitive to resolution of the organic light emitting display panel 100 are arranged in a column line adjacent to the column line in which the red pixels R and the blue pixels B are arranged.

Each of the red pixels R and the blue pixels B may be separated in a diagonal direction and arranged as a checker board pattern with the green pixels G interposed between the red pixels R and the blue pixels B. In other words, the red pixels R and the blue pixels B are alternately arranged in the column and not to be repetitively arranged.

In the present embodiment, although the pixel unit 110 is formed of the red pixels R, the blue pixels B, and the green pixels G, the pixel unit 110 may further include pixels (not shown) for displaying other colors in addition to red, green, and blue colors.

The data switch unit 130 is disposed between the data lines D1 to D8$m$ and output lines O1 to O4$m$ of data pads DP of the IC mounting area 140. The data pads DP are bonded to the data drive unit to be mounted. A wiring supplying signals from the pad unit 180 to the data switch unit 130 may be formed of two wirings 134$a$ and 134$b$ receiving a first data control signal CLA and a second data control signal CLB, respectively. The data switch unit 130 includes first data switches SW1 arranged between the odd-numbered data lines D1, D3, . . . , and D8$m$-1 of the column line, in which the red pixels R and the blue pixels B are alternately arranged, and the output lines O1 to O4$m$, and second data switches SW2 arranged between the even-numbered data lines D2, D4, . . . , and D8$m$ of the column line, in which the green pixels G are arranged, and the output lines O1 to O4$m$. Gates of the first data switches SW1 are connected in common to the wiring 134$a$ supplying the first data control signal CLA, first terminals of the first data switches SW1 are connected to the odd-numbered data lines D1, D3, . . . , and D8$m$-1, respectively, and second terminals of the first data switches SW1 are connected to the output lines O1 to O4$m$, respectively. Gates of the second data switches SW2 are connected in common to the wiring 134$b$ supplying the second data control signal CLB, first terminals of the second data switches SW2 are connected to the even-numbered data lines D2, D4, . . . , and D8$m$, respectively, and second terminals of the second data switches SW2 are connected to the output lines O1 to O4$m$, respectively.

The first data switches SW1 and the second data switches SW2 of the data switch unit 130 receive the first data control signal CLA and the second data control signal CLB for maintaining an off state through the pad unit 180 during the panel test S4 and maintain the off state in response to the first data control signal CLA and the second data control signal CLB. The data switch unit 130 receives the first data control signal CLA and the second data control signal CLB for maintaining an on state through the pad unit 180 during a driving period, in which the panel test S4 is finished and the organic light emitting display panel 100 displays images. The first data switches SW1 and the second data switches SW2 are alternately turned on and transmits data signals supplied from the data drive unit of the IC mounting area 140 to the data lines D1 to D8$m$. Also, the first data switches SW1 and the second data switches SW2 of the data switch unit 130 are alternately turned on or simultaneously turned on by the first data control signal CLA and the second data control signal CLB for maintaining the on state through the first data control signal CLA and the second data control signal CLB received from the pad unit 180 during the array test S2 and supply an array test signal AT_DATA supplied from array test pads ATP to the pixel unit 110.

The array test unit 150 is disposed between data pads DP1 to DP4$m$ of the IC mounting area 140 and the wiring test unit 160. The array test unit 150 includes a demultiplexer 152 and a plurality of array test pads ATP1 to ATPm. A wiring supplying signals from the pad unit 180 to the array test unit 150 may be formed of four wirings 154$a$ to 154$d$ receiving first to fourth array test control signals AT_A to AT_D.

The demultiplexer 152 includes a plurality of switch groups SG1, SG2, . . . , and SGm, and the respective switch groups SG1, SG2, . . . , include a plurality of array test switches AT_SW1 to AT_SW4. First terminals of the respective array test switches AT_SW1 to AT_SW4 are connected to the data pads, and second terminals thereof are connected to the array test pads ATP. The array test switches AT_SW1 to AT_SW4 of the respective switch groups SG1 to SGm connect the sequential data pads DP, the number of the sequential data pads DP having the same number as the number of the array test control signals AT_A to AT_D, to one array test pad ATP. Accordingly, the number of the array test pads ATP may be significantly reduced than the number of the data pads DP, thereby increasing a size of the array test pads ATP and intervals between the array test pads ATP. In the present embodiment, since the respective switch groups SG1 to SGm connect the four data pads DP and the one array test pad ATP, the number of the array test pads ATP may be reduced to ¼ of the number of the data pads DP.

The first array test switches AT_SW1 are connected to first data pads DP1, DP5, . . . , and DP4$m$-3. Gates of the first array test switches AT_SW1 are connected in common to the wiring 154$a$ supplying a first array test control signal AT_A. The second array test switches AT_SW2 are connected to second data pads DP2, DP6, . . . , and DP4$m$-2. Gates of the second array test switches AT_SW2 are connected in common to the wiring 154$b$ supplying a second array test control signal AT_B. The third array test switches AT_SW3 are connected to third data pads DP3, DP7, . . . , and DP4$m$-1. Gates of the third array test switches AT_SW3 are connected in common to the wiring 154$c$ supplying a third array test control signal AT_C. The fourth array test switches AT_SW4 are connected to fourth data pads DP4, DP8, . . . , and DP4$m$. Gates of the fourth array test switches AT_SW4 are connected in common to the wiring 154$d$ supplying a fourth array test control signal AT_D.

The array test pads ATP1 to ATPm are pads in contact with probe pins 300 of an array test apparatus (not shown). Since the data pad DP has a small size and a small interval between the data pads DP. Thus, the data pads DP cannot be in one-to-one contact with the probe pins 300 of the array test apparatus to perform the array test using the data pad DP. On the other hand, since the size and interval of the array test pads ATP according to the present embodiment may be increased by using the array test switches AT_SW1 to AT_SW4. Thus, the array test pads ATP can be in one-to-one contact with the probe pins 300 of the array test apparatus, and thereby performing the array test S2 becomes possible. The array test pads ATP receive and transfer array test signals AT_DATA from the probe pins 300 of the array test apparatus to the pixel unit 110 and receive a current outputted by the pixel unit 110.

The wiring test unit 160 includes a plurality of wiring test switches SD_SW. Gates of the wiring test switches SD_SW are connected in common to a wiring 164$a$ which supplies a wiring test control signal TEST_GATE. First terminals of the respective wiring test switches SD_SW are connected to the array test pads ATP, and second terminals of the respective wiring test switches SD_SW are connected in common to a wiring 164$b$ supplying a wiring test signal TEST_DATA. The wiring test switches SD_SW of the wiring test unit 160 receive the wiring test control signal TEST_GATE for maintaining a turn-off state during the array test S2 and maintain the turn-off state in response to the wiring test control signal TEST_GATE. The wiring testing unit 160 may test short-circuits/open-circuits of the wirings of the fanout unit 200 during the operation of the panel (cell) test S4 after the array test S2.

The panel test unit 170 includes a plurality of panel test switches M1 to M5 connected to other ends of the respective data lines D1 to D8$m$. In detail, the panel test unit 170 includes first panel test switches M1 connected between respective first data lines D1, D5, . . . , and D8$m$-3 and a first panel test signal wiring 174$a$, second panel test switches M2 connected between the respective first data lines D1, D5, . . . , and D8*m*-3 and a second panel test signal wiring 174*b*, fourth panel test switches M4 connected between respective second data lines D3, D7, . . . , and D8*m*-1 and the second panel test signal wiring 174*b*, fifth panel test switches M5 connected between the respective data lines D3, D7, . . . , and D8*m*-1 and the first panel test signal wiring 174*a*, and third panel test switches M3 connected between third data lines D2, D4, . . . , and D8*m* and a third panel test signal wiring 174*c*. In this case, the first panel test signal wiring 174*a*, the second panel test signal wiring 174*b*, and the third panel test signal wiring 174*c* are wirings for receiving a red test signal DC_R, a blue test signal DC_B, and a green test signal DC_G, which are direct currents, from the pad unit 180 while performing the panel test S4. The red test signal DC_R, the blue test signal DC_B, and the green test signal DC_G are supplied to the respective data lines D1 to D8*m* through the panel test unit 170.

Gates of the first panel test switches M1 and fourth panel test switches M4 are connected in common to a wiring 174*d* supplying a first panel test control signal T_Gate_C1, gates of the second panel test switches M2 and the fifth panel test switches M5 are connected in common to a wiring 174*e* supplying a second panel test control signal T_Gate_C2, and gates of the third panel test switches M3 are connected in common to a wiring 174*f* supplying a third panel test control signal T_Gate_C3.

Since the red pixels R and the blue pixels B are connected to one data line, the first panel test control signal T_Gate_C1 and the second panel test control signal T_Gate_C2 alternately turn on/off the first panel test switch M1 and fourth panel test switch M4 and the second panel test switch M2 and the fifth panel test switch M5, respectively, thereby supplying the red test signal DC_R and the blue test signal DC_B to the red pixels R and the blue pixels B, respectively.

While performing the panel test S4, a panel test control signal T_Gate for maintaining turn-on states of the first to fifth panel test switches M1 to M5, which is a direct current, is supplied to the gates of the first to fifth panel test switches M1 to M5. Accordingly, while the turn-on states of the first to fifth panel test switches M1 to M5 are being maintained, the red test signal DC_R, the blue test signal DC_B, and the green test signal DC_G supplied from the first to third panel test signal wirings 174*a*, 174*b*, and 174*c*, respectively, are supplied to the first data lines D1, D5, . . . , and D8*m*-3, the second data lines D3, D7, . . . , and D8*m*-1, and the third data lines D2, D4, . . . , and D8*m*-2.

On the other hand, the scan drive voltages VDD/VSS and the scan control signal SCS and the like are supplied to the scan drive unit 120. Then, the scan drive unit 120 sequentially generates and supplies scan signals to the pixel unit 110. Accordingly, the pixels receiving the scan signals and the panel test signals emit lights and display images, thereby performing a lighting test and the like.

In the present embodiment, although all the switches M1 to M5, SW1 to SW2, AT_SW1 to AT_SW4, and SD_SW are shown as PMOS-type transistors, the present invention is not limited thereto and all of them may be NMOS-type transistors or they may be mutually different conduction-type transistors.

Hereinafter, referring to FIG. 4, the array test S2 according to the present embodiment will be described.

A plurality of probe pins 300 of the array test apparatus are in contact with the array test pads ATP of the organic light emitting display panel 100 after finishing the array process S1. The array test apparatus applies the array test signal AT_DATA, which is a voltage, to the pixels through the probe pins 300. In this stage, the wiring test switches SD_SW of the wiring test unit 160 are turned off. The first to fourth array test switches AT_SW1 to AT_SW4 are sequentially turned on, and the first and the second data switches SW1 and SW2 of the data switch unit 130 are sequentially or simultaneously turned on too.

While the first data switches SW1 are being turned on, the first to fourth array test switches AT_SW1 to AT_SW4 are sequentially turned on and defective pixels are detected by using the array test pads ATP. And then while the second data switches SW2 are being turned on, the first to fourth array test switches AT_SW1 to AT_SW4 are sequentially turned on and defective pixels are detected by using the array test pads ATP For example, while the first array test switch AT_SW1 and the first data switch SW1 are being turned on, the plurality of probe pins 300 of the array test apparatus is in contact with the array test pads ATP and applies the array test signal AT_DATA to a first group, that is, pixels connected to D1, D9, . . . and D8*m*-7, . . . of the pixel unit 110 through the array test pads ATP.

The scan drive voltages VDD/VSS and the scan control signal SCS and the like are supplied to the scan drive unit 120. Then, the scan drive unit 120 sequentially or simultaneously generates and supplies scan signals to the pixel unit 110. Accordingly, the array test signal AT_DATA is supplied to the pixel circuits.

After that, the plurality of probe pins 300 of the array test apparatus are in contact with the array test pads ATP again and sense currents outputted from the first group in response to the applied array test signal AT_DATA, thereby detecting a defective pixel.

Similarly, while the second array test switches AT_SW2 and the first data switches SW1 are being turned on, the array test signal AT_DATA is applied to a second group, that is, pixels connected to D3, D11, . . . and D8*m*-5, . . . of the pixel unit 110 through the array test pads ATP and then currents outputted from the second group through the array test pads ATP and the currents outputted from the second group through the array test pads ATP are sensed, thereby detecting a defective pixel.

Similarly, the array test switches AT_SW1 to AT_SW4 and the first and the second data switches SW1 and SW2 are being sequentially turned on, currents of each pixel are sensed, thereby detecting a defective pixel. The timing of turning on the first and second data switches SW1 and SW2 and the array test switches AT_SW1 to AT_SW4 is not fixed but is changeable.

Another example, while the first to fourth array test switches AT_SW1 to AT_SW4 and the first and the second data switches SW1 and SW2 are being turned on, the plurality of probe pins 300 of the array test apparatus is in contact with the array test pads ATP and applies the array test signal AT_DATA to a first group to m-th group of the pixel unit 110 through the array test pads ATP.

The scan drive voltages VDD/VSS and the scan control signal SCS and the like are supplied to the scan drive unit 120. Then, the scan drive unit 120 sequentially or simultaneously generates and supplies scan signals to the pixel unit 110. Accordingly, the array test signal AT_DATA is supplied to the pixel circuits.

After that, the plurality of probe pins 300 of the array test apparatus are in contact with the array test pads ATP again and sequentially sense currents outputted from the first group to m-th group in response to the applied array test signal AT_DATA, thereby detecting a defective pixel.

While the first array test switches AT_SW1 and the first data switches SW1 are being turned on, currents outputted from the first group, pixels connected to D1, D9, . . . and D8m-7 of the pixel unit 110 are sensed, thereby detecting a defective pixel.

Similarly, while the first array test switches AT_SW1 and the second data switches SW2 are being turned on, currents outputted from the second group, pixels connected to D2, D10, and D8m-6 . . . of the pixel unit 110 are sensed, thereby detecting a defective pixel.

Similarly, while the array test switches AT_SW1 to AT_SW4 and the first and the second data switches SW1 and SW2 are being sequentially turned on, currents of each pixel are sensed, thereby detecting a defective pixel.

The timing of turning on the first and second data switches SW1 and SW2 and the array test switches AT_SW1 to AT_SW4 is not fixed but is changeable.

In the present embodiment, an array test unit is formed of a demultiplexer of 4:1 but is not limited thereto and may be formed of various sizes of demultiplexer such as 2; 1, 3:1, 4:1, and 5:1 by considering an interval between array test pads according to a panel design and a condition of the array test apparatus.

Figure 5:
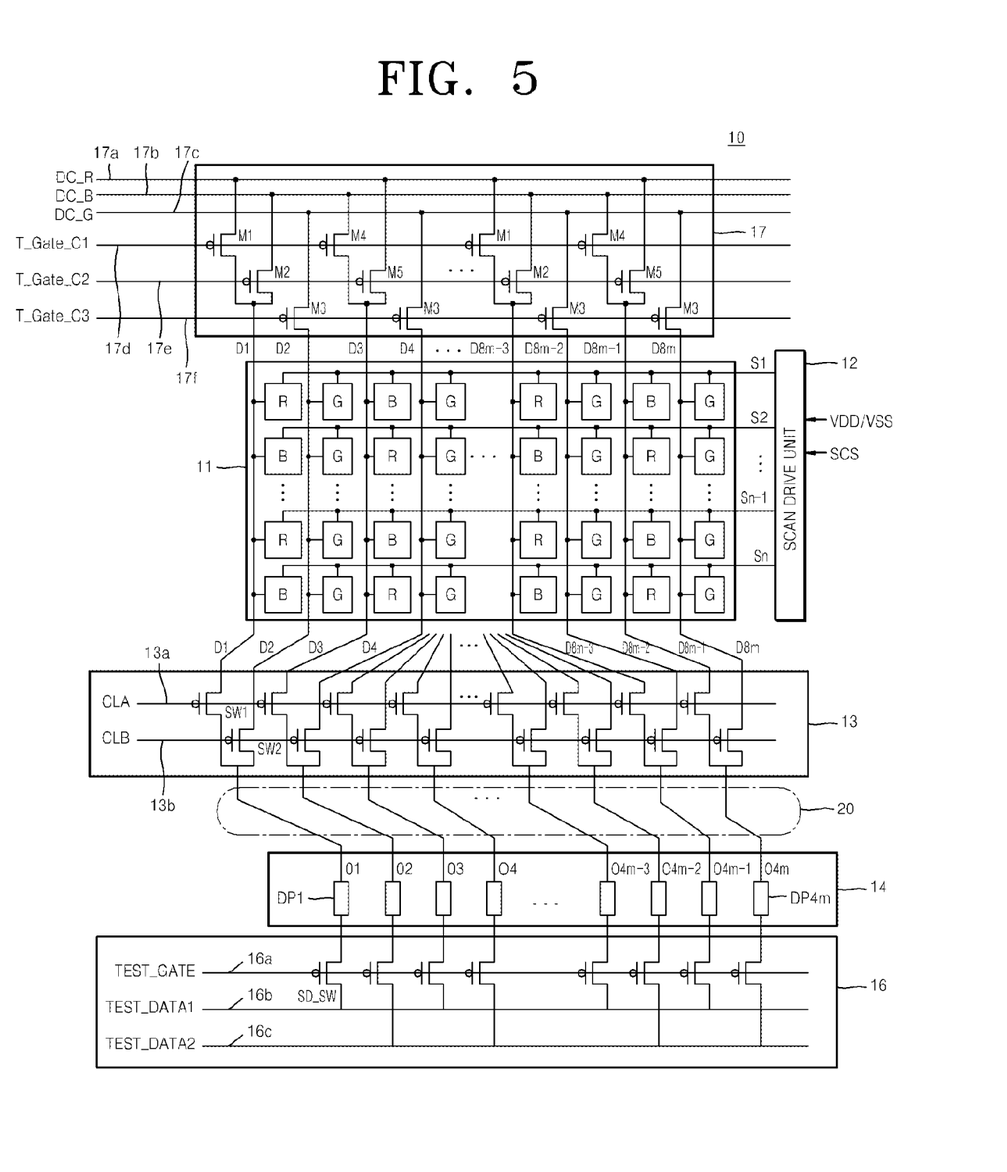
FIG. 5 is a view illustrating a comparative example corresponding to the organic light emitting display panel of FIG. 2.

FIG. 5 is a view illustrating a comparative example corresponding to the organic light emitting display panel 100.

Referring to FIG. 5, an organic light emitting display panel 10 according to the comparative example includes a pixel unit 11, a data switch unit 13, an IC mounting area 14, and a wiring test unit 16.

The pixel unit 11 includes first pixels, second pixels, and third pixels emitting different colors, in which the first and second pixels are alternately arranged in the same column line and the third pixels are arranged in a column line adjacent the column line in which the first and second pixels are arranged. The first pixels may be red pixels R emitting red light, the second pixels may be blue pixels B emitting blue light, and the third pixels may be green pixels G emitting green light. Since the arrangement of the pixels of the pixel unit 11 is similar to that of the pixel unit 110 according to the present embodiment, a detailed description thereof will be omitted.

The data switch unit 13 is disposed between data lines D1 to D8m and output lines O1 to O4m of data pads DP of the IC mounting area 14. The data pads DP are bonded to a data drive unit by using a COG method and electrically connected to the data drive unit. The data switch unit 13 includes first data switches SW1 arranged between first data lines D1, D3, . . . , and D8m-1 of the column line, in which the red pixels R and the blue pixels B are alternately arranged, and the output lines O1 to O4m and second data switches SW2 arranged between second data lines D2, D4, . . . , and D8m of the column line, in which the green pixels G are arranged, and the output lines O1 to O4m. Gates of the first data switches SW1 are connected in common to a wiring 13a supplying a first control signal CLA. Gates of the second data switches SW2 are connected in common to a wiring 13b supplying a second control signal CLB.

While the organic light emitting display panel 10 is normally operating, the first data switches SW1 and the second data switches SW2 of the data switch unit 13 are alternately turned on by the first control signal CLA and the second control signal CLB and supply data signals supplied form the data drive unit of the IC mounting area 14 to the pixel unit 11.

The wiring test unit 16 includes a plurality of wiring test switches SD_SW to test short-circuits and open-circuits of wirings of a fanout unit 20. Gates of the wiring test switches SD_SW are connected in common to a wiring 16a which supplies a wiring test control signal TEST_GATE. First terminals of the respective wiring test switches SD_SW are connected to the data pads DP of the IC mounting area 14.

Second terminals of odd-numbered wiring test switches SD_SW are connected in common to a wiring 16b which supplies a first wiring test signal TEST_DATA1, and second terminals of even-numbered wiring test switches SD_SW are connected in common to a wiring 16c which supplies a second wiring test signal TEST_DATA2. The wiring test switches SD_SW receive a wiring test control signal TEST_GATE for maintaining a turn-on state during a wiring test and maintains the turn-on state in response to the wiring test control signal TEST_GATE. Also, the first wiring test signal TEST_DATA1 is supplied to the odd-numbered wiring test switches SD_SW, and the second wiring test signal TEST_DATA2 is supplied to the even-numbered wiring test switches SD_SW. The first wiring test signal TEST_DATA1 may be white data for displaying white, and the second wiring test signal TEST_DATA2 may be black data for displaying black. Short-circuits between adjacent wirings and open-circuits of respective wirings of the fanout unit 20 may be detected by supplying mutually different signals to the adjacent wirings of the fanout unit 20.

The panel test unit 17 includes a plurality of panel test switches M1 to M5 to perform a panel test. Gates of the first panel test switches M1 and fourth panel test switches M4 are connected in common to a wiring 17d supplying a first panel test control signal T_Gate_C1, gates of the second panel test switches M2 and the fifth panel test switches M5 are connected in common to a wiring 17e supplying a second panel test control signal T_Gate_C2, and gates of the third panel test switches M3 are connected in common to a wiring 17f supplying a third panel test control signal T_Gate_C3.

Since the red pixels R and the blue pixels B are connected to one data line, the first panel test control signal T_Gate_C1 and the second panel test control signal T_Gate_C2 alternately turn on/off the first panel test switch M1 and fourth panel test switch M4 and the second panel test switch M2 and the fifth panel test switch M5, respectively, thereby supplying a red test signal DC_R and a blue test signal DC_B to the red pixels R and the blue pixels B, respectively. When the third panel test switches M3 are turned on by the third panel test control signal T_GATE_C3, a green test signal DC_G is supplied to the green pixels G.

In the case of the organic light emitting display panel 10, since the wiring test unit 16 is directly connected to the data pads DP of the IC mounting area 14, the two wiring test signals TEST_DATA1 and TEST_DATA2 are needed to detect the short-circuits between the adjacent wirings and the open-circuits of the respective wirings of the fanout unit 20.

Also, since the organic light emitting display panel 10 does not include an additional circuit unit performing an array test, it is impossible to test an array of a pixel circuit after the array process is finished. Also, contact between the data pads DP of the IC mounting area 14 and the array test apparatus is necessary to perform an array test. However, as the resolution of display apparatuses gradually becomes higher, the number of pixels and the number of data lines are increased, thereby increasing the number of data pads DP. Accordingly, one-to-one contact between a probe pin of an array test apparatus and a data pad becomes impossible because of the small size of the data pads DP and a narrow gap between adjacent data pads DP.

On the other hand, the organic light emitting display panel 100 according to the present embodiment, as shown in FIG. 4, includes the array test unit 150 performing the array test S2 between the IC mounting area 140 and the wiring test unit 160. The array test unit 150 includes the demultiplexer 152 formed of the plurality of array test switches AT_SW1 to AT_SW4. The demultiplexer 152 makes it possible to use one array test pad ATP connected to two or more data pads DP for array testing. Accordingly, the number of the array test pads ATP may be significantly reduced and the size of the test array test pads ATP can be large enough to accommodate the probe pins. Accordingly, probe pins of an array test apparatus may be in one-to-one contact with array test pads and contact accuracy may be increased, thereby performing an array test.

Also, the organic light emitting display panel 110 may selectively turn on the plurality of array test switches AT_SW1 to AT_SW4. Accordingly, although only one wiring test signal TEST_DATA is supplied to the wiring test unit 160, mutually different signals can be supplied to adjacent wirings of the fanout unit 200. Thus detecting short-circuits and open-circuits of the adjacent wirings of the fan-out unit 200 can be achieved. Accordingly, the number of pads for supplying a wiring test signal may be reduced.

According to the embodiments of the present invention, a demultiplexer and test pads having a more appropriate size than those of typical data pads are formed in a space below a COG mounting area, thereby detecting defects of pixels by performing an array test becomes possible. Also, defects in an array process can be detected and panels having defects can be repaired in an early stage of the manufacturing process.

While the present invention has been particularly shown and described with reference to exemplary embodiments, it is understood that various changes and modifications can be made by those of ordinary skill in the art without departing from the spirit and scope of the present invention as defined by the following claims.

What is claimed is:

1. An organic light emitting display panel comprising:
   a pixel unit comprising a plurality of pixels displaying mutually different colors;
   a plurality of data pads electrically connected to wirings extending from the data lines, each of the plurality of data pads being connected to corresponding data lines, respectively; and
   an array test unit applying an array test signal to the plurality of pixels of the pixel unit, and sensing a current outputted from the plurality of pixels,
   wherein the array test unit comprises an array test pad electrically connected to a plurality of data pads through a plurality of array test switches.

2. The organic light emitting display panel of claim 1, wherein the array test switches form a demultiplexer having the plurality of array test switches, each of the array test switches being connected between one of the plurality of data pads and the array test pads.

3. The organic light emitting display panel of claim 2, wherein a gate of each of the plurality of array test switches is connected to one of a plurality of wirings supplying a plurality of array test control signals.

4. The organic light emitting display panel of claim 3, wherein the plurality of array test switches comprises:
   first array test switches, gates of which are connected in common to a wiring supplying a first array test control signal;
   second array test switches, gates of which are connected in common to a wiring supplying a second array test control signal;
   third array test switches, gates of which are connected in common to a wiring supplying a third array test control signal; and
   fourth array test switches, gates of which are connected in common to a wiring supplying a fourth array test control signal.

5. The organic light emitting display panel of claim 2, wherein the demultiplexer comprises a plurality of switch groups connecting the same number of sequential data pads as a number of array test control signals to one array test pad, and
   wherein each switch group comprises a plurality of array test switches whose gates are connected to the wirings supplying the respective array test control signals and the plurality of array test switches of the each switch group are sequentially turned on in response to the array test control signal.

6. The organic light emitting display panel of claim 2, further comprising a wiring test unit testing short-circuits and open-circuits of the wirings extending from the data lines.

7. The organic light emitting display panel of claim 6, wherein the wiring test unit comprises a plurality of wiring test switches, gates of which are connected in common to a wiring supplying a wiring test control signal, first terminals of which are connected to the array test pads, respectively, and second terminals of which receive a wiring test signal.

8. The organic light emitting display panel of claim 6, wherein the wiring test unit maintains an off state while the array test unit is performing an array test.

9. The organic light emitting display panel of claim 1, further comprising a data switch unit selectively applying data signals outputted from the data pads to the pixel column of the pixel unit.

10. The organic light emitting display panel of claim 1, further comprising a data drive unit bonded to the data pads by using a chip-on-glass (COG) method and applying data signals to the data lines.

11. An organic light emitting display panel comprising:
    a plurality of array test pads configured to be connected to probe pins of an array test apparatus and receiving an array test signal to test a pixel circuit array; and
    a demultiplexer disposed between a plurality of data pads connected to respective wirings extending from data lines of the pixel unit and the array test pads and selectively applying the array test signal provided from the array test pad to a pixel of the pixel unit through the data pad.

12. The organic light emitting display panel of claim 11, wherein the demultiplexer comprises a plurality of array test switches, in which a gate of each array test switch is connected to one of a plurality of wirings supplying a plurality of array test control signals, a first terminal of each array test switch is connected to one of the plurality of data pads, and a second terminal of each array test switch is connected to one of the plurality of array test pads.

13. The organic light emitting display panel of claim 12, wherein the plurality of array test switches comprises:
    first array test switches, gates of which are connected in common to a wiring supplying a first array test control signal;
    second array test switches, gates of which are connected in common to a wiring supplying a second array test control signal;
    third array test switches, gates of which are connected in common to a wiring supplying a third array test control signal; and
    fourth array test switches, gates of which are connected in common to a wiring supplying a fourth array test control signal.

14. The organic light emitting display panel of claim 11, wherein the demultiplexer comprises a plurality of switch groups connecting the same number of sequential data pads as a number of the array test control signals to one array test pad, and wherein each switch group comprises a plurality of array test switches whose gates are connected to wirings supplying the respective array test control signals and the plurality of array test switches of the each switch group are sequentially turned on in response to the array test control signal.

15. The organic light emitting display panel of claim 11, wherein the array test pad has a larger size than that of the data pad and an interval between the array test pads is wider than an interval of the data pads.

16. The organic light emitting display panel of claim 11, further comprising a wiring test unit testing shorts and opens of the wirings extended from the data lines.

17. The organic light emitting display panel of claim 16, wherein the wiring test unit comprises a plurality of wiring test switches, gates of which are connected in common to a wiring supplying a wiring test control signal, first terminals of which are connected to the array test pads, respectively, and second terminals of which receive a wiring test signal.

18. The organic light emitting display panel of claim 16, wherein the wiring test unit maintains an off state while the array test unit is performing an array test.

19. The organic light emitting display panel of claim 11, further comprising a data switch unit selectively applying data signals outputted from the data pads to the pixel column of the pixel unit.

20. The organic light emitting display panel of claim 11, further comprising a data drive unit bonded to the data pads by using a COG method and applying data signals to the data lines.

\* \* \* \* \*